United States Patent
Olander et al.

(10) Patent No.: US 7,485,169 B2
(45) Date of Patent: *Feb. 3, 2009

(54) SEMICONDUCTOR MANUFACTURING FACILITY UTILIZING EXHAUST RECIRCULATION

(75) Inventors: W. Karl Olander, Indian Shores, FL (US); Joseph D. Sweeney, Brookfield, CT (US); Luping Wang, Brookfield, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/519,681

(22) Filed: Sep. 12, 2006

(65) Prior Publication Data

US 2007/0062167 A1   Mar. 22, 2007

Related U.S. Application Data

(63) Continuation of application No. 10/672,051, filed on Sep. 26, 2003, now Pat. No. 7,105,037, which is a continuation-in-part of application No. 10/284,910, filed on Oct. 31, 2002, now Pat. No. 6,770,117.

(51) Int. Cl.
  *F24F 3/16* (2006.01)
  *H01L 21/00* (2006.01)

(52) U.S. Cl. .......................... 55/385.2; 55/420; 55/424; 55/467; 55/485; 55/486; 96/417; 96/418; 454/187; 454/228; 454/230; 454/233; 454/236; 422/122; 422/177

(58) Field of Classification Search ................ 55/385.1, 55/315, 318, 524, 521, 385.2, 420, 424, 467, 55/485, 486; 96/108, 134, 135, 121, 132, 96/153, 154, 417, 418; 454/187, 228, 230, 454/233, 236; 502/417; 210/502.1; 422/122, 422/177

See application file for complete search history.

(56) References Cited

U.S. PATENT DOCUMENTS

| | | | |
|---|---|---|---|
| 4,050,368 A | | 9/1977 | Eakes |
| 4,549,472 A | * | 10/1985 | Endo et al. .................. 454/187 |
| 4,693,175 A | | 9/1987 | Hashimoto |
| 4,869,734 A | * | 9/1989 | Jacquish ....................... 95/111 |
| 5,004,483 A | * | 4/1991 | Eller et al. ...................... 95/10 |
| 5,090,972 A | * | 2/1992 | Eller et al. ...................... 95/10 |
| 5,096,477 A | * | 3/1992 | Shinoda et al. ............ 55/385.2 |
| 5,350,336 A | | 9/1994 | Chen et al. |
| 5,518,528 A | | 5/1996 | Tom et al. |
| 5,972,060 A | | 10/1999 | O'Halloran et al. |
| 6,080,060 A | | 6/2000 | Larsson |
| 6,196,050 B1 | | 3/2001 | Ikeda et al. |

(Continued)

*Primary Examiner*—Duane Smith
*Assistant Examiner*—Minh-Chau T. Pham
(74) *Attorney, Agent, or Firm*—Steven J. Hultquist; Intellectual Property Technology Law; Maggie Chappuis

(57) ABSTRACT

A semiconductor manufacturing process facility requiring use therein of air exhaust for its operation, such facility including clean room and gray room components, with the clean room having at least one semiconductor manufacturing tool therein, and wherein air exhaust is flowed through a region of the clean room. The facility includes an air exhaust treatment apparatus arranged to (i) receive air exhaust after flow thereof through said region of said clean room, (ii) produce a treated air exhaust, and (iii) recirculate the treated air exhaust to an ambient air environment in the facility, e.g., to the gray room of the facility.

20 Claims, 1 Drawing Sheet

U.S. PATENT DOCUMENTS

| | | |
|---|---|---|
| 6,264,550 B1 | 7/2001 | Matsumoto |
| 6,280,507 B1 | 8/2001 | Walker |
| 6,280,691 B1 * | 8/2001 | Homeyer et al. ............ 422/122 |
| 6,284,020 B1 | 9/2001 | Mizuno et al. |
| 6,328,776 B1 | 12/2001 | Shanks et al. |
| 6,358,139 B1 | 3/2002 | Renz |
| 6,585,192 B2 | 7/2003 | Beers |
| 6,605,134 B2 | 8/2003 | Ishihara et al. |
| 6,641,635 B1 | 11/2003 | Chiesl |
| 6,740,147 B2 * | 5/2004 | Kishkovich et al. ........... 96/135 |
| 6,749,655 B2 | 6/2004 | Dautenhahn |
| 6,749,671 B2 | 6/2004 | Holst et al. |
| 6,770,117 B2 | 8/2004 | Olander |
| 7,105,037 B2 * | 9/2006 | Olander et al. ............. 55/385.2 |
| 2001/0015133 A1 | 8/2001 | Sakai et al. |
| 2005/0005585 A1 * | 1/2005 | Kim .......................... 55/467.1 |
| 2005/0039425 A1 | 2/2005 | Olander et al. |
| 2005/0050866 A1 * | 3/2005 | Mullins ..................... 55/385.1 |
| 2005/0284292 A1 * | 12/2005 | Ruan .......................... 95/226 |

* cited by examiner

SEMICONDUCTOR MANUFACTURING FACILITY UTILIZING EXHAUST RECIRCULATION

CROSS-REFERENCE TO RELATED PATENTS

This is a continuation of U.S. patent application Ser. No. 10/672,051, filed Sep. 26, 2003 in the names of W. Karl Olander, et al., now U.S. Pat. No. 7,105,037, which in turn is a continuation-in-part of U.S. patent application Ser. No. 10/284,910, filed Oct. 31, 2002 in the name of W. Karl Olander, now U.S. Pat. No. 6,770,117. Priority is claimed under the provisions of 35 USC §120. The disclosures of said prior U.S. patent applications are incorporated herein by reference in their entirety, for all purposes.

FIELD OF THE INVENTION

The present invention relates generally to semiconductor manufacturing facilities and processes wherein substantial volumes of heat/general exhaust are generated in semiconductor manufacturing processes and require management in the overall operation of such facilities.

DESCRIPTION OF THE RELATED ART

In the field of semiconductor manufacturing, a variety of unit operations are carried out that require the make-up and use of exhaust streams.

In the semiconductor manufacturing plants in which such operations are conducted, energy consumption is driven by facility systems, such as chillers, air recirculation and make-up fans, exhaust air systems and on-site gas generation plants, which may in a typical semiconductor "fab" account for about 60% of energy consumption.

The maintenance of fab cleanliness, provision of fresh air to replace process exhaust and removal of heat from process tools are primary contributors to large-scale energy usage of heating, ventilating and air conditioning (HVAC) systems in the semiconductor manufacturing plant. Reductions in exhaust are desirable, since make-up air requirements and HVAC system loads can thereby be minimized in the facility.

The exhaust requirement of a fab involves several categories of gas streams: (i) heat/general exhaust, (ii) acid exhaust, (iii) an optional ammonia exhaust and (iv) volatile organic compound (VOC) exhaust. The majority of the process effluent in the fab is small in volumetric flow rate, typically in the range of from about 2 to about 10 cubic feet per minute, and point-of-use abatement systems are employed for treatment of such streams to keep hazardous materials out of the ducts of the facility, and to limit exposure to personnel in the plant.

Process effluent after point-of-use treatment flows through the centralized acid exhaust unit of the facility and exits the plant via roof scrubbers, viz., scrubbing units that are mounted on the roof of the fab building. Wet bench process exhaust is flowed directly to the roof-mounted scrubbers because of the high flow rates of the gas stream involved. Heat exhaust is frequently vented in an untreated form.

In general, process tools and gas/chemical areas of the fab use containment enclosures for reasons of maximizing safety in the semiconductor manufacturing operation. Typically, process enclosures of such type are operated at negative pressure conditions relative to the fab environment, to further limit the potential for release of toxics into the work zone. In many instances, the containment exhaust is large in proportion to the actual risk of chemical exposure, under the impetus of industry practices and safety codes directed to achieving 5-10 air exchanges per minute. This high-volumetric flow regime of exhaust gas is further increased in the case of pyrophoric and flammable materials.

It is generally recognized that ion implanters, wet benches and gas cabinets account for a large portion of the total exhaust requirement of a fab. For example, ion implanter exhaust specifications typically range from about 1500 to about 3500 cubic feet per minute, of which the process exhaust typically accounts for 1-2 cubic feet per minute, the gas box exhaust typically accounts for 300-400 cubic feet per minute, and the remainder is typically attributable to heat exhaust.

In the implanter, the fab air is drawn into the containment enclosure through louvers or other openings along the sides of the enclosure, and cools the power supply and high-energy components of the unit, being finally exhausted through vent stacks on the top of the implanter enclosure. Exhaust air temperature may be on the order of from about 75 to 85° F. Since a leak in the process exhaust piping or a significant release of gas from the gas box in the implanter enclosure has the potential to contaminate the heat exhaust stream, a large majority of fabs vent the heat exhaust, e.g., at a flow rate of 1000-2000 cubic feet per minute, to the house central exhaust system of the fab.

The heat/general exhaust in the semiconductor manufacturing plant or other process facility hereinafter is referred to as "air exhaust" and denotes an air stream that is flowed through process tool housings, cabinets, fume regions, abatement units, containment enclosures, and other discrete volumetric regions within the plant, for example, as (i) a "sweep gas" to shroud, transport or dilute contaminants that pose a health, safety, or environmental risk to persons and/or processes in the plant, and/or (ii) a convective heat transfer medium, to remove heat from equipment (e.g., fab tools such as ion implanters, vaporizers and vapor deposition reactors, plasma generators, etc.), regions and/or other process streams associated with semiconductor manufacturing operation.

The air exhaust may contain substantial sensible heat and be at high elevated temperatures in some instances, depending on the heat removal duty of the air stream in a particular application when the air exhaust serves a heat exhaust function. The air exhaust depending on the specific application may have a substantial volumetric flow rate, e.g., on the order of from several hundred cubic feet per minute to several thousand cubic feet per minute or higher.

In general, the air exhaust is non-contaminated with respect to toxic or otherwise hazardous components, and any concentrations of extraneous gaseous component(s) deriving from the tool or other local environment of the fab are typically extremely low due to the substantial volumetric flow rate of the air stream being used.

Prior practice in semiconductor manufacturing fabs has included the provision of so-called "house exhaust" systems, which frequently take the form of roof-mounted wet scrubber unit(s). Alternatively, or additionally, dry adsorption scrubber unit(s), thermal oxidation (incineration) unit(s), catalytic oxidation unit(s), and the like are utilized in such house exhaust systems.

Since house exhaust systems are utilized for processing of combined effluent streams of a semiconductor manufacturing facility, including process effluents from semiconductor manufacturing tools, the sweep gases that are used to entrain any leakage, outgassing, or in situ generated gas species, and the bulk coolant gas flows that yield the heat exhaust of the facility, the house exhaust system is usually grossly over-designed relative to the actual concentrations of toxic or otherwise hazardous gases requiring removal.

Accordingly, the high volumetric rate flow of air exhaust through the house exhaust system of a fab requires substantial capital and operating costs in respect of the exhaust system, and due to the extremely low levels or even absence of contaminants in the air exhaust, the level of treatment provided by the house exhaust system is largely if not totally wasted in the normal operation of the facility.

As an illustrative unit operation embodying typical exhaust management issues, high volumetric flows of air exhaust may be employed in ion implantation operations, to dilute any toxic release emanating from a pump, piping or coupling malfunction, as well as to remove latent heat from the large concentration of electrical equipment and pumps. The implanter enclosure may be exhausted at a flow rate on the order of 2000 cubic feet per minute (CFM). At this volumetric flow rate, the exhaust-handling system may be oversized by a factor of 6-7 relative to a corresponding exhaust-handling system that is not required to process the air exhaust from the fab. The oversized house exhaust system includes not only a larger volume and more expensive scrubber and/or other effluent abatement unit(s), but also larger capacity fans and blowers, large diameter ducting, etc., all of which are associated with increased costs of operation and maintenance.

In addition to the foregoing air exhaust management issues, it is to be appreciated that the costs of supplying air for air exhaust usage are substantial, since the fresh make-up air for the air exhaust stream must be filtered, dehumidified or otherwise humidity-adjusted, and heated or cooled to a set temperature, to ensure that it is clean, dry and thermally appropriate for air exhaust usage, and then such conditioned air must be transported to various locations around the fab. As a result, the air processing/handling requirements and associated capital equipment and operating costs for the air exhaust are substantial.

Thus, air exhaust represents a significant cost factor in fab construction and operation, and imposes a substantial impact on the economics and energy utilization efficiency of the fab.

It would therefore be an advance in the art to provide fabs with markedly improved air exhaust systems that substantially reduce costs of air exhaust, and eliminate the burden of air exhaust on conventional house exhaust systems.

SUMMARY OF THE INVENTION

The present invention relates generally to semiconductor manufacturing facilities, and processes, in which air exhaust is employed and requires management in the operation of the processing facility.

In one aspect, the present invention relates to semiconductor manufacturing process facility requiring use therein of air exhaust for its operation, such facility including clean room and gray room components, with the clean room having at least one semiconductor manufacturing tool therein, and wherein air exhaust is flowed through a region of the clean room. The facility includes an air exhaust treatment apparatus arranged to (i) receive air exhaust after flow thereof through the aforementioned region of said clean room, (ii) produce a treated air exhaust, and (iii) recirculate the treated air exhaust to an ambient air environment of the facility.

In another aspect, the invention relates to a method of operating a semiconductor manufacturing process facility requiring use therein of air exhaust for its operation, such facility including clean room and gray room components, with the clean room having at least one semiconductor manufacturing tool therein, and wherein air exhaust is flowed through a region of the clean room. The method includes treating air exhaust after flow thereof through the aforementioned region of said clean room to produce a treated air exhaust, and recirculating the treated air exhaust to an ambient air environment of the facility.

Other aspects, features and advantages of the invention will be more fully apparent from the ensuing disclosure and appended claims.

DETAILED DESCRIPTION OF THE INVENTION AND PREFERRED EMBODIMENTS THEREOF

Figure 1:
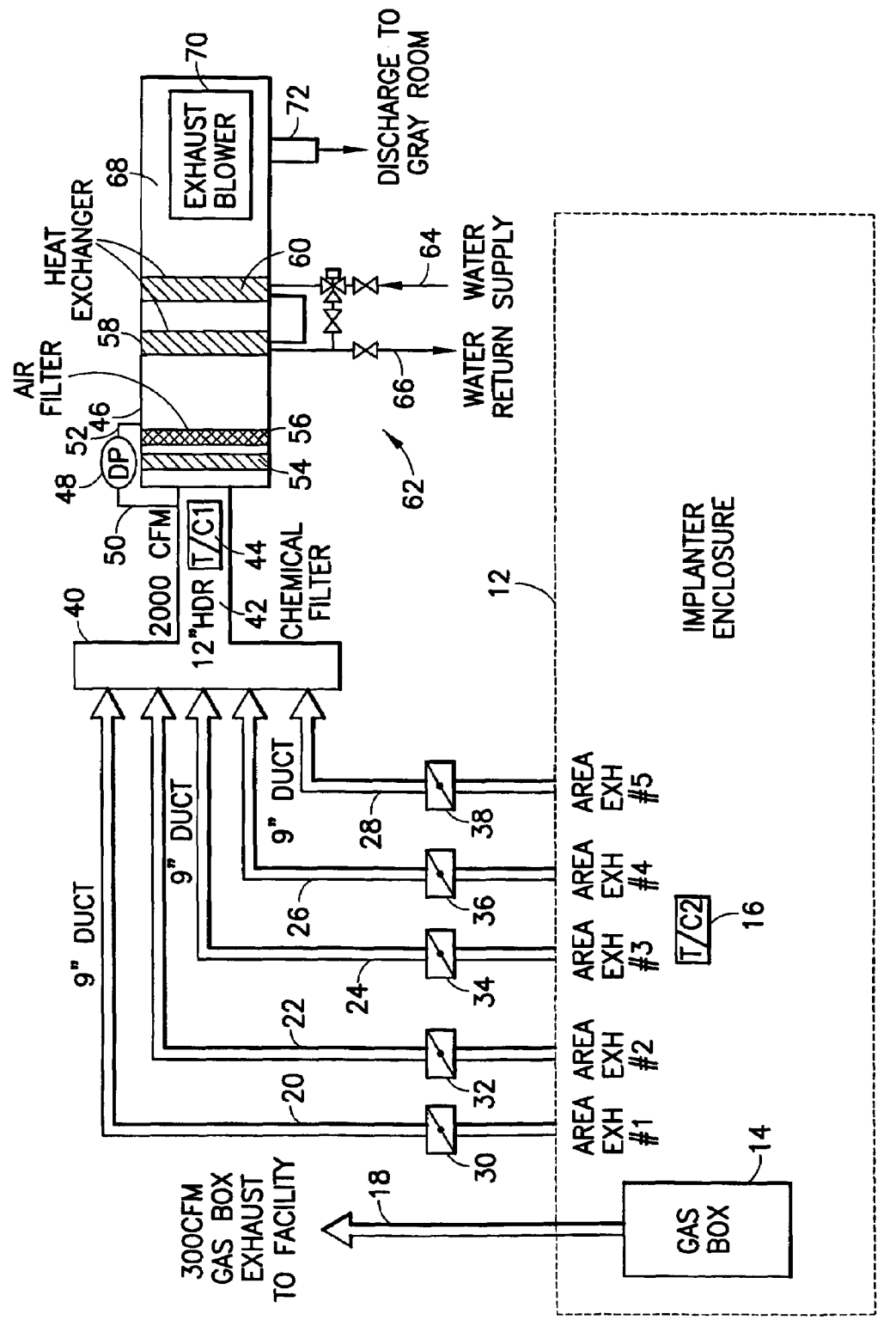
FIG. 1 is a schematic representation of a semiconductor manufacturing facility including an ion implantation unit and an exhaust treatment unit, according to one embodiment of the invention.

The present invention is based on the discovery that exhaust processing in semiconductor facilities can be carried out in a highly efficient manner by purification treatment of air exhaust to remove contaminant species therefrom, followed by recirculation of resulting treated air exhaust to the fab, e.g., to the gray room of the semiconductor facility. Such approach removes the air exhaust from the gas flows that must be processed by the house exhaust system, and is readily implemented with ancillary equipment whose incremental cost is extremely favorable to overall economics of semiconductor plant operation, relative to current standard practice.

As a specific example, the exhaust treatment apparatus and method of the present invention in application to ion implantation operations enables the radical approach of largely decoupling the implanter unit from the house exhaust system of the semiconductor facility.

The prevailing view of the semiconductor industry has been that high capacity effluent abatement systems afford economies of scale and simplify the task of effluent treatment in relation to a facility that typically employs many different types of unit operations—e.g., chemical vapor deposition, ion implantation, photoresist ashing and wet stripping, reactive ion etching, sputtering formation of films, and sublimation-based boule growth, to name but a few—all of which produce different effluents that must be treated.

As discussed in the Background section hereof, house exhaust systems in many semiconductor manufacturing plants include over-designed roof-mounted installations. In facilities with such over-designed effluent abatement systems, volumetric bulk gas flow rates in the ducting and flow channels of the house exhaust system may include on the order of 100,000 CFM or more of exhaust gas, typically air. As also mentioned earlier herein, the continuous replacement (fresh make-up) of this exhaust is expensive, ranging from about $4 to about $10 per cubic foot of air, depending on the semiconductor manufacturing facility involved.

The present invention, by the provision of a dedicated treatment apparatus for the air exhaust, removes the air exhaust from the burden of gas flows imposed on the house exhaust treatment system, and produces a treated air exhaust that can be released to the ambient air environment of the semiconductor manufacturing facility for reuse. By recirculating the purified clean dry air within the semiconductor manufacturing facility for reuse, rather than venting it to the atmosphere from a rooftop scrubber (as in conventional practice), the air exhaust recirculation scheme of the invention avoids the necessity of providing a substantial amount of new make-up air in a clean, dry and temperature-adjusted condition.

Where the air exhaust is constituted by heat exhaust, the exhaust treatment apparatus may in addition to gas purification capability include heat exchange unit(s) for removing heat from the heat exhaust so that it is adjusted to the temperature of the ambient air in the fab.

In a preferred embodiment, the recirculated air exhaust is flowed to the gray room of the semiconductor manufacturing facility. In such embodiment, the semiconductor manufacturing facility is constructed in a conventional manner to include a clean room having a suitable level of cleanliness for manufacture of integrated circuitry and other microelectronic products, e.g., a cleanliness in a range of from Class M1 (ISO Class 3) to Class M6 (ISO Class 9), as well as a gray room in which equipment is contained, and ancillary rooms such as gowning rooms for donning of clean room suits, air-shower rooms, etc.

The gray room environment of the semiconductor manufacturing facility is separated from the clean room environment by a wall or partition, with the gray room environment being of a generally clean character that is not required to meet clean room standards. The gray room typically is of lower cleanliness than the clean room.

The clean room/gray room arrangement permits semiconductor manufacturing tools and ancillary equipment to project through the wall or partition into the clean room, to conserve valuable floor space of the clean room, while permitting service and maintenance on the tools and ancillary equipment to be performed in the gray room via provision of tool and equipment access ports in such gray room environment.

The air exhaust treatment apparatus can be of any suitable type that is effective to purify the air exhaust of contaminants, e.g., toxic, hazardous or otherwise undesirable gases, and produce a treated air exhaust suitable for recirculation within the semiconductor manufacturing facility. The air exhaust treatment apparatus can for example include a chemical filter that includes a suitable chemisorbent or physical sorbent material having sorptive affinity for the gas species desired to be removed from the air exhaust in the purification thereof.

The chemical filter preferably includes a chemisorbent that is chemically reactive with the undesired gas species, e.g., hydrides, halides, acid gases, organometallic reagents, etc., that may be present in the air exhaust flowed through the fab environment, such as through a process tool containment enclosure, through a point-of-use abatement tool, through a gas cabinet, or through or along any gas flow path in which the air stream performs an exhaust function, such as for example sweeping toxic leakage of gas out of a gas cabinet, or cooling the hot elements of an ion implantation system. The chemisorbent employed in such chemical filter can be of any suitable type, e.g., a metal oxide scrubber medium effective for removal of hazardous hydride gases from the air exhaust.

The purifying action of the chemical filter can be augmented by deployment in the treatment apparatus, e.g., in a separate downstream zone within a housing of the treatment apparatus, of a particle filter for removing particulate material from the air exhaust.

The air exhaust treatment apparatus can as a further aspect include one or more heat exchangers, such as in a downstream portion of the housing of the treatment apparatus, to effect cooling of the air exhaust, particularly when the air exhaust is used as a cooling stream for convective heat dissipation from a process tool or associated flow circuitry, monitoring devices, etc.

Still further, the air exhaust treatment apparatus can include suitable monitoring and detection devices, e.g., in a downstream end portion of a housing of the apparatus, to monitor the continued effectiveness of the treatment apparatus for producing a treated air exhaust of recycle quality, or alternatively to provide an indication when the treatment apparatus has ceased to be effective for such purpose, such as when the chemical filter has become depleted of chemical reagent and is no longer effective for purifying the air exhaust.

Such monitoring and detection devices may for example include a breakthrough or end-point detector that produces an alarm or other output indicative of the passage of target hazardous gas species through the chemical filter without abatement. The monitoring and detection devices may also include a thermal sensor, e.g., a thermocouple element, that is effective to monitor the temperature of the treated air exhaust discharged from the exhaust treatment apparatus, and trigger an alarm or other perceptible output indicative of the failure of a heat exchanger in the treatment apparatus to cool a heat exhaust stream to a suitable level for recirculation.

The features and advantages of the invention are more fully shown with respect to FIG. 1 hereof, which is a schematic representation of a semiconductor manufacturing facility 10.

The semiconductor manufacturing facility 10, or fab, may comprise a structural installation, e.g., a building or other structural edifice, including clean room, gray room and other installation areas of the facility. The fab includes an ion implanter tool that is contained in an implanter enclosure 12 that has a gas box 14 mounted therein, together with ancillary equipment that is well-known in the art and requires no elaboration herein.

The implanter enclosure may be constituted by a housing or containment vessel that is louvered or otherwise provided with openings therein (not shown) for ingress into the interior volume of the enclosure of air and flow therethrough for removal of heat and sweep-out of any leakage of contaminant species from the gas box or associated flow circuitry in the enclosure. The resulting heat exhaust is discharged from the implanter enclosure in discharge ducts 20, 22, 24, 26, and 28, having flow control dampers 30, 32, 34, 36 and 38 therein, respectively. The discharge ducts may be selectively positioned at the top wall of the implanter enclosure, at locations (e.g., at exhaust areas designated in FIG. 1 as "AREA EXH #1," "AREA EXH #1," "AREA EXH #2," "AREA EXH #3," "AREA EXH #4" and "AREA EXH #5") that provide effective hydrodynamic flow-through of the heat exhaust, into the respective ducts, which in the illustrative embodiment shown may have a diameter on the order of 9 inches.

The implanter enclosure 12 may have any suitable monitoring and control means therein, as necessary or desirable for the operation of the ion implantation tool, and air exhaust operation. For example, the enclosure may have a thermocouple 16 or other temperature sensing device in the enclosure, which is suitably integrated with a centralized control unit, such as a programmably arranged central processing unit (CPU), microprocessor, programmable logic controller (PLC) system, or other means for effective operation of the implanter. For example, the thermocouple 16 may be operatively coupled with a controller that responsively adjusts the settings of the flow control dampers 30, 32, 34, 36 and 38 to modulate the flow of the heat exhaust in proportion to the heat being generated in the implanter enclosure 12. The flow circuitry although shown schematically can include any suitable piping, conduits, flow passages, manifolding, etc., as appropriate to the specific air exhaust employed in the processing facility. The gas box of the implanter as shown discharges a gas box exhaust in discharge line 18. The gas box exhaust may in a specific embodiment be discharged at a flow rate of 300-400 cubic feet per minute (CFM).

The ion implanter although shown schematically, can and typically does include an ion implantation process chamber, a gas cabinet containing the source gas for the implant operation, a vacuum pump, a beam launch, a control cabinet, an end station, a stocker and a mini-environment, etc., as components for conducting the ion implant operation. The source gas for the ion implantation operation in a particularly preferred embodiment can be supplied by dispensing from a low pressure dopant source of the type described in Tom et al. U.S. Pat. No. 5,518,828, which will permit the gas storage and delivery unit to be exhausted at flow rates on the order of 50-100 CFM. Alternatively, any other suitable source of the ion implantation species can be employed.

Although not shown for ease of illustration, the ion implanter tool produces an ion implantation process effluent which is discharged from the tool in an effluent line and may be flowed to a roof-mounted abatement system of the fab, or alternatively may be flowed to a point-of-use abatement unit to treat the process effluent containing ionic fragments, recombined species, carrier gas, etc., followed by flow of the locally treated process effluent to the house exhaust system for final treatment and discharge. Such point-of-use abatement unit can be of any suitable type, e.g., a catalytic oxidation unit, a scrubber unit (wet and/or dry), etc.

From the discharge ducts 20, 22, 24, 26, and 28, the air exhaust (heat exhaust) from the implanter enclosure flows into the header 40, which in a specific embodiment is a 12-inch header receiving the combined air exhaust at a flow that may be on the order of 2000 CFM. From the header, the combined air exhaust flows into the discharge passage 42 containing thermocouple 44 therein for monitoring the temperature of the air exhaust, and passes into the air exhaust treatment unit 46 containing chemical filter 54, air filter 56, heat exchangers 58 and 60 (coupled by flow circuitry 62 including valved water supply line 64 and water return line 66 to a suitable source of cooling water (not shown)), and at the downstream end portion of the interior volume of the air exhaust treatment unit, the air exhaust enters exhaust blower 70, and is finally discharged in discharge conduit 72 for recirculation to an ambient air environment of the fab, e.g., to the gray room of the fab, so that the recirculated air exhaust rejoins the open air volume in the fab building.

The exhaust treatment unit 46 may be provided, as shown, with a differential pressure gauge 48 coupled to upstream piping leg 50 and downstream piping leg 52, to provide a pressure sensing output. The pressure sensing output may in turn be employed to modulate the speed of the exhaust blower 70, or otherwise be used to adjust, monitor or control the operative elements of the exhaust handling system.

In like fashion, the temperature of the heat exhaust that is sensed by thermocouple 44 may be employed to responsively modulate the flow of coolant in the flow circuitry 62 to ensure that the desired cooling of the heat exhaust is achieved, so that it is suitable for recirculation to the fab.

The heat exhaust treatment unit 46 in this embodiment is provided in a housing as a unitary module. The chemical filter 54 may comprise any suitable material having sorptive affinity for undesirable contaminant components that may be present in the heat exhaust gas stream. The sorbent material may comprise two or more sorbent species, or alternatively may comprise a single material that is effective to purify the heat exhaust of undesirable components thereof. The scrubber material may comprise chemisorbent media or physical sorbent media, or a combination of the two.

The sorbent material may be provided in any suitable form, e.g., in a particulate form or in other discontinuous form, of regular or irregular geometric shape, and of suitable size and size distribution to provide appropriate surface area to the heat exhaust in the contacting operation during which the heat exhaust is scrubbed of undesirable contaminants. The scrubbing material therefore may be provided in a fixed bed, through which the heat exhaust gas stream is flowed. Such bed may be sized and shaped to provide appropriate pressure drop and through-flow characteristics, consistent with basic fixed bed adsorbent vessel design considerations.

One preferred scrubber material usefully employed in the practice of the invention is S520 resin (commercially available from ATMI, Inc., Danbury, Conn., USA), which is effective to remove hydrides as well as acid gas contaminants (e.g., boron trifluoride) from the heat exhaust. The scrubber material may be provided in a honeycomb form to achieve superior capture of the contaminant species, while maintaining low pressure drop in the chemical filter of the treatment unit.

The air filter 56 may be of any suitable type, as effective to remove particulates form the heat exhaust. Although illustratively shown downstream of the chemical filter, it will be appreciated that an air filter may alternatively, or additionally, be provided upstream of the chemical filter.

The heat exhaust purified of contaminants by contact with the scrubber material and filtered of particulates by contact with the air filter 56 then is flowed through the heat exchangers 58 and 60. The heat exchangers may as illustrated communicate with coolant feed lines, whereby a coolant medium is flowed into the heat exchanger in heat exchange passages therein, for cooling of the heat exhaust, with discharge of the coolant medium from the heat exchanger in coolant discharge line 66. The discharged coolant in line 66 thus removes heat from the heat exhaust. Alternatively, the heat exchanger components may effect expansion cooling of the heat exhaust, or other modality and means may be employed for effecting removal of heat from the heat exhaust.

The heat exchangers are an optional component of the air exhaust treatment unit, and may be omitted in instances where the fab has ample cooling capacity built into its HVAC systems, since fab air is continually recirculated through chillers and filters in the fab environment.

The air exhaust treatment unit may further contain a toxic gas monitor, by which the heat exhaust is monitored for the presence of any contaminant species therein. The toxic gas monitor may be positioned upstream of the chemical filter to alert operators when a leakage event has occurred and is in progress (when the influent air exhaust to the air exhaust treatment unit is contaminated by leakage or other contamination). Alternatively, the toxic gas monitor can be deployed downstream of the chemical filter, to provide an alarm or other output indicating that contaminated air exhaust is breaking through the chemical filter. As a still further alternative, the air exhaust treatment unit may include toxic gas monitors upstream and downstream of the chemical filter. The toxic gas monitor(s) in such instance can be arranged to actuate shut-down of the implanter, terminate flow of dopants, shut down the implant blower, increase flow of gas box exhaust while maintaining negative pressure therein (so that contamination is swept away and does not mix with the heat exhaust), etc.

Alternatively, the toxic gas monitor may be arranged to actuate an alarm to alert an operator to change out the chemical filter, to replace the scrubbing medium with fresh material.

By flow of the treated heat exhaust to the ambient environment of the fab, the added burden of gas that would otherwise exist, if the heat exhaust were flowed to the house exhaust system is avoided. As a result, the house exhaust system may be smaller and more efficiently designed for the final treatment of exhaust air from the fab.

The air exhaust treatment unit in accordance with the invention is advantageously configured as a high throughput, high kinetic efficiency air purifier/filter installation that enables the heat exhaust to be returned to the fab. Such air purifier/filter installation may be sized and constructed to enable linear velocities of suitable magnitude, e.g., from about 0.1 to about 2 meters/second, to be achieved in the flow of the heat exhaust through the air purifier/filter unit.

By the provision of the dedicated air exhaust treatment unit in accordance with the invention, in a typical semiconductor manufacturing facility of the type schematically shown in FIG. 1, it is possible to reuse 1000-2000 CFM of heat exhaust per ion implanter in the fab, which would otherwise have been flowed to the roof abatement unit in prior art practice. Since this recirculated heat exhaust rejoins the gaseous environment in the fab, from which make-up air is drawn for use in the tool to remove heat therefrom, a substantial savings is achieved. Since the overall house exhaust requirements are decreased, it is possible to achieve a capital cost reduction on the order of U.S.$100/CFM in the house exhaust system in new fab construction.

While the invention has been illustratively described in reference to ion implantation as a representative semiconductor manufacturing unit operation, it will be recognized that the invention is not thus limited, but rather is applicable to a wide variety of processing operations, including for example epitaxial and diffusion-type reactions, and other processes where the ability to reuse exhaust will reduce costs and energy requirements.

Accordingly, although the invention has been described herein with reference to illustrative features, aspects and embodiments, it will be appreciated that the invention may be practiced with modifications, variations and in other embodiments, as will suggest themselves to those of ordinary skill based on the disclosure herein. The invention therefore is to be interpreted and construed, as encompassing all such modifications, variations, and other embodiments, within the spirit and scope of the claims hereafter set forth.

What is claimed is:

1. A process facility requiring use therein of air exhaust for its operation, such facility including a processing tool generating heat and contaminants in said operation, and an air exhaust recirculation system arranged to flow air exhaust so that it captures at least a portion of said heat and contaminants generated by the processing tool, said air exhaust recirculation system comprising an air exhaust treatment apparatus adapted to (i) thermally condition the air exhaust and recover heat therefrom, and (ii) reduce contaminants of the air exhaust to a level safe for breathing exposure in the process facility, and the air exhaust recirculation system being adapted to recirculate the air exhaust, after thermal conditioning and contaminant reduction thereof, to cool other apparatus or structure in the process facility.

2. The process facility of claim 1, wherein the air exhaust treatment apparatus comprises a sorbent adapted to remove toxic gas components from the air exhaust.

3. The process facility in claim 2, wherein the sorbent comprises a chemisorbent.

4. The process facility of claim 1, wherein the processing tool is contained in an enclosure through which the air exhaust is flowed by said air exhaust recirculation system.

5. The process facility of claim 1, wherein the air exhaust treatment apparatus comprises a filter.

6. The process facility of claim 1, wherein the air exhaust treatment apparatus comprises a heat exchanger.

7. The process facility of claim 1, wherein the air exhaust recirculation system comprises flow circuitry containing a motive driver for the air exhaust.

8. The process facility of claim 1, wherein the processing tool is adapted to operate at negative pressure.

9. The process facility of claim 7, wherein the flow circuitry is coupled with at least one gas monitor.

10. The process facility of claim 1, wherein the facility includes clean room and gray room components, and said other apparatus or structure in the process facility are in said gray room component of the process facility.

11. The process facility of claim 1, wherein the processing tool comprises a semiconductor manufacturing tool.

12. The process facility of claim 11, wherein said processing tool comprises an ion implantation tool.

13. The process facility according to claim 12, wherein said ion implantation tool comprises an implanter enclosure, through which air exhaust is flowed, wherein said implanter enclosure includes a multiplicity of discharge passages for discharge of air exhaust after it has captured at least a portion of said heat and contaminants generated by the ion implanter, wherein each of said discharge passages is coupled to a manifold arranged for flow of air exhaust containing said heat and contaminants, to the air exhaust treatment apparatus.

14. The process facility of claim 13, wherein each of the discharge passages from the implanter enclosure contains a flow control device that is adjustable to modulate the flow of the air exhaust therethrough, said process facility further comprising a temperature sensor in the implanter enclosure, and a controller responsive to said temperature sensor to adjust the adjustable flow control devices in the discharge passages in response to temperature sensed by said temperature sensor, so that flow of the air exhaust in said discharge passages is modulated in response to heat generated in the implanter enclosure.

15. The process facility of claim 1, wherein said processing tool generates an effluent, and said process facility includes a house exhaust treatment system, and flow circuitry coupling the processing tool and said house exhaust treatment system, for flow of processing tool effluent to the house exhaust treatment system.

16. The process facility of claim 1, wherein said air exhaust treatment apparatus comprises a metal oxide scrubber medium arranged for contacting the air exhaust to remove at least part of said contaminants from the air exhaust.

17. The process facility of claim 1, wherein the air exhaust after thermal conditioning and contaminant reduction thereof is recirculated to cool another process tool, flow circuitry, or a monitoring device.

18. The process facility of claim 1, wherein said air exhaust is recirculated for convective heat dissipation.

19. The process facility of claim 1, wherein the air exhaust treatment apparatus further comprises a toxic gas monitor arranged to actuate shut-down of the processing tool upon detection of toxic gas in the air exhaust.

20. The process facility of claim 1, wherein the air exhaust treatment apparatus comprises a scrubber that is effective to remove hydrides and acid gas contaminants from the air exhaust.

* * * * *